(12) United States Patent
Cheng et al.

(10) Patent No.: US 7,242,589 B1
(45) Date of Patent: Jul. 10, 2007

(54) STACKABLE MODULAR COMPUTER HOUSING, AND COMPUTER DEVICE INCLUDING THE SAME

(75) Inventors: Sheng-Hsiung Cheng, Taipei Hsien (TW); Te-An Lin, Taipei Hsien (TW); Chij-Hsiung Chen, Taipei Hsien (TW); Wu-Nan Wang, Taipei Hsien (TW)

(73) Assignee: Aopen, Inc., Hsichih (TW)

( * ) Notice: Subject to any disclaimer, the term of this patent is extended or adjusted under 35 U.S.C. 154(b) by 0 days.

(21) Appl. No.: 11/607,486

(22) Filed: Nov. 30, 2006

(30) Foreign Application Priority Data

Jun. 6, 2006 (TW) .............................. 95120012 A (51) Int. Cl.
*H05K 7/00* (2006.01)
(52) U.S. Cl. ...................................... 361/735; 439/928
(58) Field of Classification Search ................ 439/928; 361/735, 683, 684, 736

See application file for complete search history.

(56) References Cited

U.S. PATENT DOCUMENTS 5,838,548 A * 11/1998 Matz et al. .................. 361/784
5,909,357 A * 6/1999 Orr ............................ 361/687

\* cited by examiner

*Primary Examiner*—Phuong Dinh
(74) *Attorney, Agent, or Firm*—Schwabe, Williamson & Wyatt, P.C.

(57) ABSTRACT

A stackable modular computer housing includes a rectangular frame, and top and bottom covers. The frame includes upright left and right side plates, a hollow connecting plate, two first slide portions extending respectively from top edges of the side plates, and two second sliding potions disposed below the side plates. The top cover includes a rectangular top plate and two third slide portions disposed at left and right edges of the top plate. The bottom cover includes a rectangular bottom plate, and two fourth slide portions disposed at left and right edges of the bottom plate. The third and fourth slide portions engage slidably and respectively the first and second slide portions, thereby enabling the top and bottom covers to slidably cover top and bottom sides of the frame. Two positioning plates cover front and rear openings of the frame, respectively.

22 Claims, 6 Drawing Sheets

STACKABLE MODULAR COMPUTER HOUSING, AND COMPUTER DEVICE INCLUDING THE SAME

CROSS-REFERENCE TO RELATED APPLICATION

This application claims priority of Taiwanese Application No. 095120012, filed on Jun. 6, 2006.

BACKGROUND OF THE INVENTION

1. Field of the Invention

The invention relates to a computer housing, more particularly to a stackable modular computer housing, and a computer device including the same.

2. Description of the Related Art

A commercially available computer housing is generally provided with reserved expansion spaces so as to meet various expansion requirements, and is therefore designed to have a size larger than actually needed.

However, with the development of technology, the efficiency of various hardware devices (e.g., motherboards, hard disks, microprocessors) within the computer housing has been enhanced to such an extent that a single tiny device can have a very high efficiency. Thus, chances that a computer needs to be expanded are little, and there served expansion spaces of the computer housing are generally not utilized, thereby resulting in a waste of space. Besides, the computer housing appears unnecessarily bulky.

In view of the above-depicted situation, there are also available micro computer housings. Although available spaces are fully utilized in a micro computer housing, it does not allow for hardware expansion.

SUMMARY OF THE INVENTION

Therefore, an object of the present invention is to provide a stackable modular computer housing that can partition available spaces in a computer device into modular units and that is expandable according to requirements.

Another object of the present invention is to provide a computer device with stackable modular computer housings, which is expandable according to requirements.

Accordingly, a stackable modular computer housing of the present invention includes a rectangular frame, a top cover, a bottom cover, and two positioning plates. The frame includes an upright left side plate, an upright right side plate spaced apart from the left side plate, a connecting plate connected to bottom edges of the left and right side plates and having a central hollow portion, two first slide portions extending respectively from top edges of the left and right side plates, and two second slide portions disposed respectively below the left and right side plates and parallel to the first slide portions, respectively.

The top cover includes a rectangular top plate and two third slide portions disposed respectively at left and right lateral edges of the top plate. The third slide portions are engageable with the first slide portions, respectively, so as to be slidable forwardly and rearwardly relative to each other such that the top cover slidably covers a top side of the frame.

The bottom cover includes a rectangular bottom plate and two fourth slide portions disposed at left and right lateral edges of the bottom plate. The fourth slide portions are engageable with the second slide portions, respectively, so as to be slidable forwardly and rearwardly relative to each other such that the bottom cover slidably covers a bottom side of the frame.

The positioning plates cover front and rear openings of the frame, respectively.

The computer device of the present invention includes the aforesaid computer housing and a hardware unit.

The hardware unit includes a motherboard disposed on the connecting plate of the frame, a central processing unit disposed on the motherboard, and at least one storage device connected to the motherboard.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail, it should be noted that like elements are denoted by the same reference numerals throughout the disclosure.

Referring to FIGS. 1 to 4, the first preferred embodiment of a computer device having a stackable modular computer housing according to the present invention is shown to include an aluminum extruded computer housing 1 and a hardware unit 2 mounted within the computer housing 1.

The computer housing 1 includes a frame 3 that can be used alone or in numbers according to expansion requirements, top and bottom covers 4, 5 to cover top and bottom sides of the frame 3, and a plurality of positioning plates 6 and a plurality of fastening members 7. In the first preferred embodiment, the computer housing 1 includes a single frame 3.

The frame 3 includes upright left and right side plates 31, 32 that are spaced apart from each other, a connecting plate 33 that has a central hollow portion, and that is connected to bottom edges of the left and right sides plates 31, 32, two first slide portions 34 in the form of protruding rails, two second slide portions 35 disposed parallel to the first slide portions 34, respectively, and two retaining grooves 36 provided respectively on inner surfaces of the left and right side plates 31, 32 and extending lengthwise.

The first slide portions 34 project respectively from top edges of the left and right side plates 31, 32 toward each other. The second slide portions 35 extend downwardly from a bottom side of the connecting plate 33 proximate to left and right edges of the connecting plate 33, respectively, and further extend outwardly in opposite directions such that they have an L-shaped profile. Each of the second slide portions 35 cooperates with the connecting plate 33 to define a sliding groove that opens outwardly and that extends lengthwise. The first and second slide portions 34, 35 are modularly designed such that they not only can engage third and fourth slide portions 42, 52, respectively (to be described hereinbelow), they can also interengage. Thus, additional frames can be put on top of or below the frame 3 to permit expansion (to be described in detail hereinafter).

The top cover 4 includes a rectangular top plate 41 and two third slide portions 42 for engaging the first slide portions 34. The bottom cover 5 includes a rectangular bottom plate 51 and two fourth slide portions 52 which are disposed to engage the second slide portions 35, respectively, and which are in the form of protruding rails.

The two third slide portions 42 are respectively disposed at left and right lateral edges of the top plate 41. Each of the third slide portions 42 includes a curved plate 421 extending downwardly and curvedly from a respective one of the left and right lateral edges of the top plate 41, and an L-shaped plate 422 that extends downwardly from a lower surface of the top plate 41 proximate to the respective one of the left and right later a ledges of the top plate 41 and that further extends outwardly. The curved plate 421 and the L-shaped plate 422 cooperatively define a sliding groove that opens outwardly. The two fourth slide portions 52 are protruding rails that extend upwardly and respectively from left and right lateral edges of the bottom plate 51 and that further extend inwardly toward each other. The top cover 4 and the bottom cover 5 slidably cover top and bottom sides of the frame 3, respectively.

In the computer housing 1 of this embodiment which has a single frame 3, there are two positioning plates 6 that respectively cover a front opening defined by front edges of the left and right side plates 31, 32 and a rear opening defined by rear edges of the left and right side plates 31, 32. The positioning plates 6 are provided with a plurality of screw holes 61 in positions corresponding to the retaining grooves 36 in the inner surfaces of the left and right side plates 31, 32 and the third slide portions 42 of the top cover 4. By extending the fastening members 7 through the corresponding screw holes 61 into the third slide portions 42 and the retaining grooves 36, the positioning plates 6 can be fastened to the frame 3 and the top cover 4. To meet requirements of the hardware unit 2, the positioning plates 6 are respectively provided with wiring openings, heat dissipating vents, optical disk drive access ports, card insertion slots, etc., which are, however, not described in detail herein and are merely illustrated schematically or omitted in the drawings since they are not crucial features of the present invention.

Figure 1:
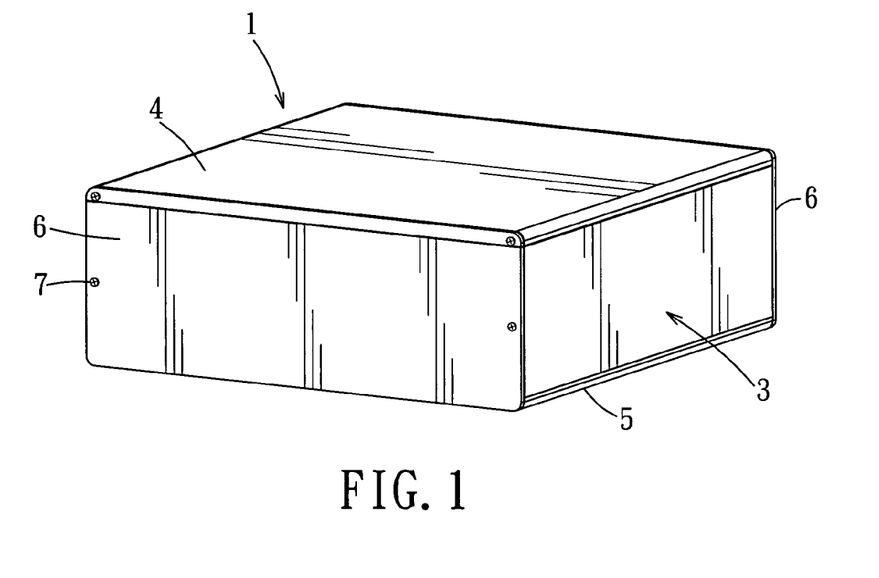
FIG. 1 is a perspective view of a stackable modular computer housing of the first preferred embodiment of a computer device according to the present invention.
Figure 2:
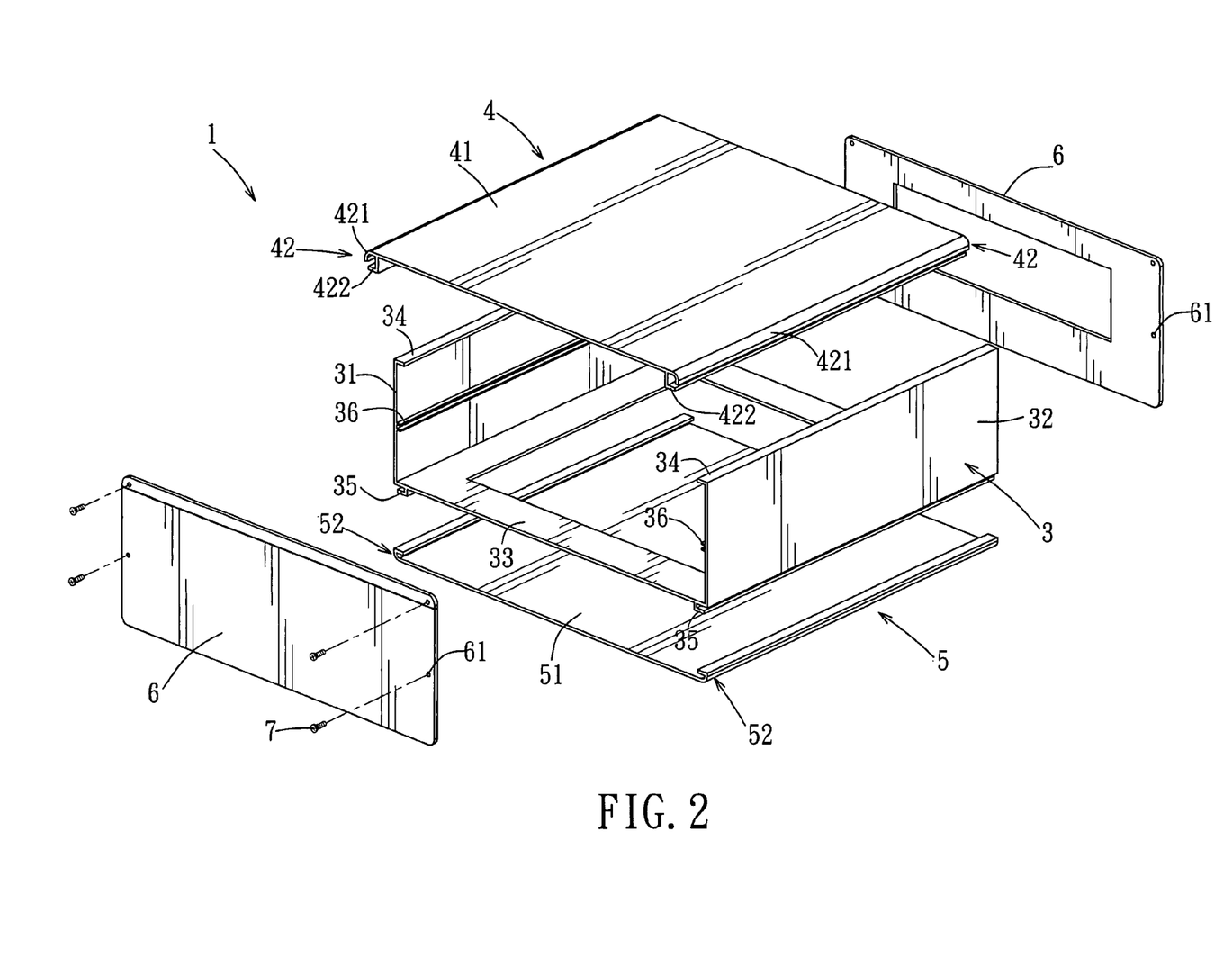
FIG. 2 is an exploded perspective view of the computer housing of the first preferred embodiment.
Figure 3:
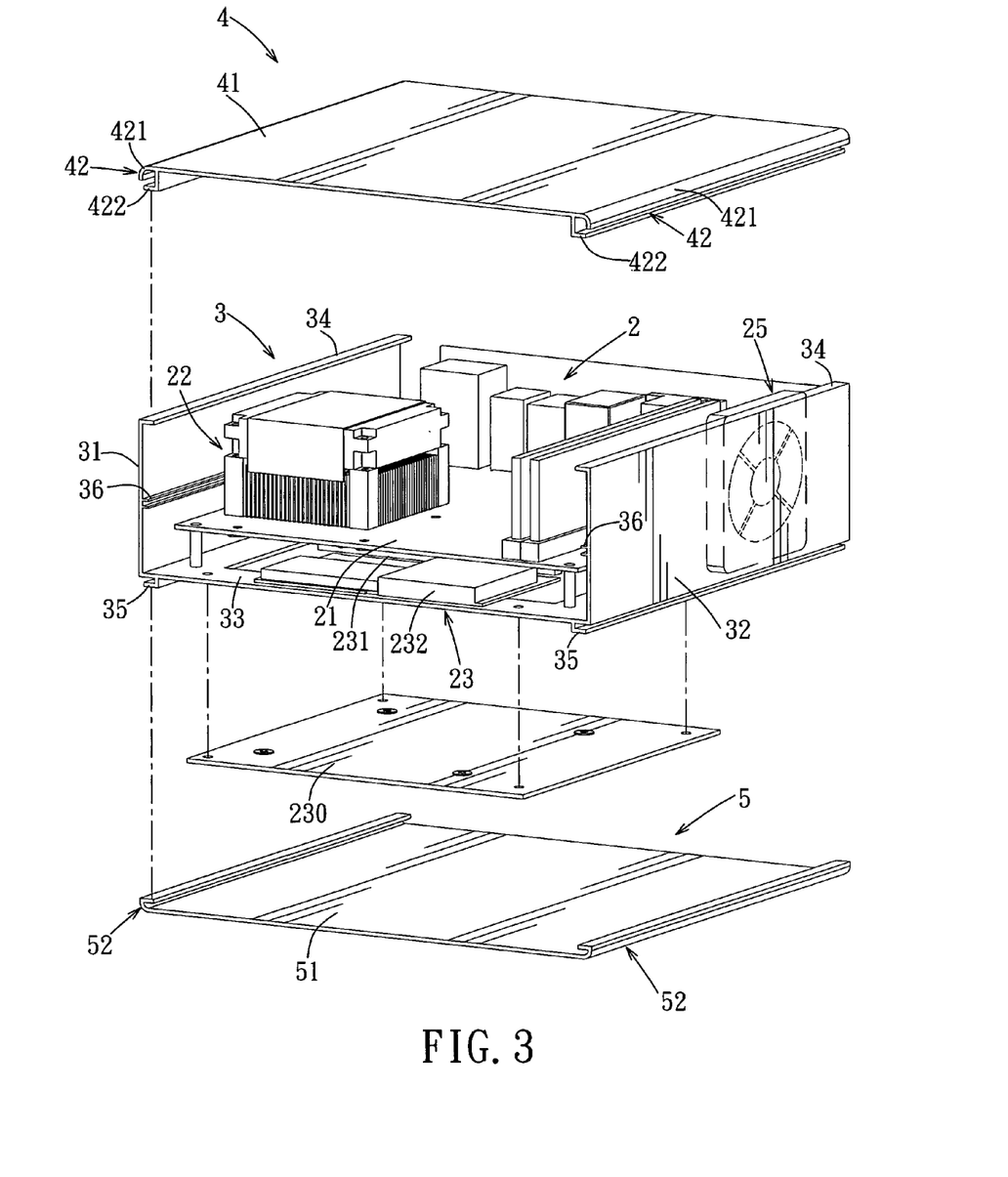
FIG. 3 is an exploded perspective view to illustrate an assembly relationship between the computer housing and a computer hardware unit of the first preferred embodiment.
Figure 4:
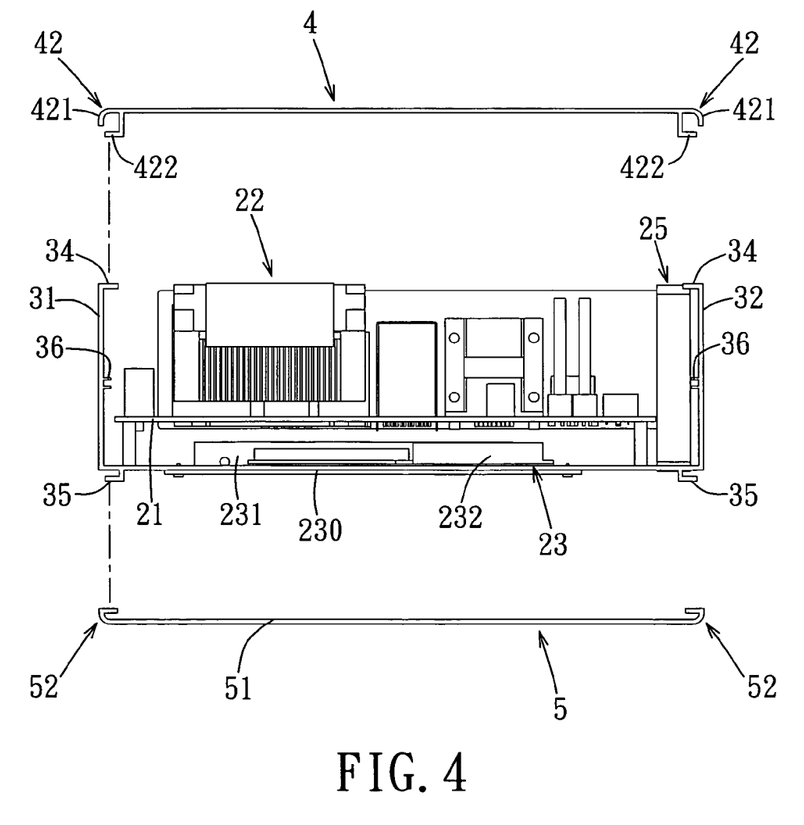
FIG. 4 is a side view of FIG. 3.

Referring to FIGS. 3 and 4, the hardware unit 2 mounted within the computer housing 1 of this embodiment is a standard computer system capable of normal operation, which obtains power supply through an external transformer (not shown), and includes a motherboard 21 disposed on the connecting plate 33, a central processing unit 22 disposed on the motherboard 21, a plurality of storage devices 23 connected to the motherboard 21, and a system fan 25 mounted uprightly within the frame 3 and disposed on one side of the mother board 21. The system fan 25 can generate a current of air to carry away some of the heat generated as a result of operation of the storage devices 23 and the central processing unit 22. The hardware unit 2 may be secured on the connecting plate 33 of the frame 3 using a positioning frame or in any other suitable manner. As this is not the crux of this invention, it will not be discussed in detail herein for the sake of brevity.

In this embodiment, there are two storage devices 23, which are, respectively, a hard disk 231 and a card reader 232 that are accommodated between the bottom cover 5 and the motherboard 21 parallel to the motherboard 21, and which are secured on a positioning frame 230 that is detachably secured to the connecting plate 33. The storage devices 23 can be secured within the frame 3 in other manners not limited to the above.

Figure 5:
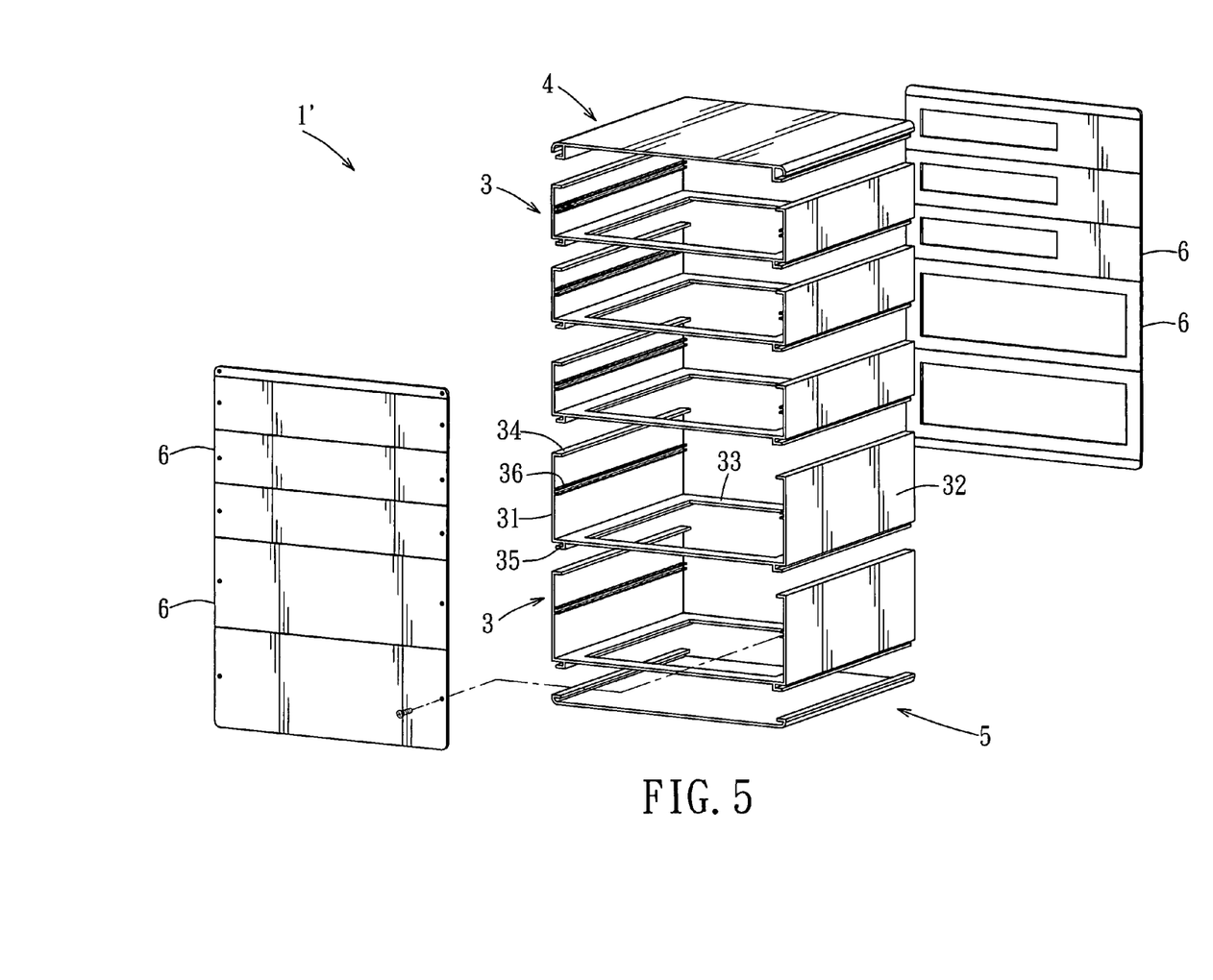
FIG. 5 is an exploded perspective view of a stackable modular computer housing of the second preferred embodiment of a computer device according to the present invention.
Figure 6:
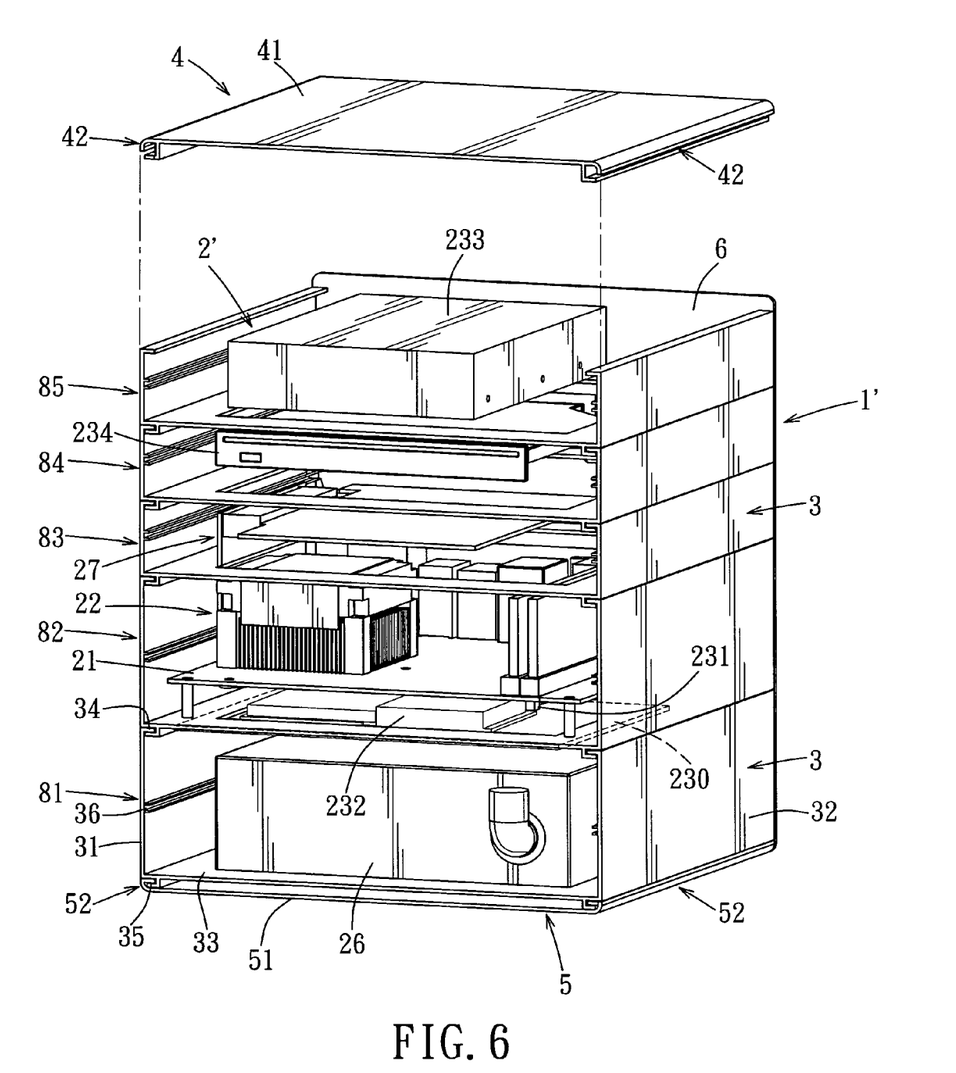
FIG. 6 is an assembled perspective view to illustrate an assembly relationship between the computer housing and a hardware unit of the second preferred embodiment.

Referring to FIGS. 5 and 6, the second preferred embodiment of a computer device according to the present invention is expandable by increasing the number of the frames 3, and includes a computer housing 1' and a hardware unit 2'. The computer device of this embodiment as a whole is generally divided into a power layer 81, a motherboard layer 82, an upright expansion card layer 83, an optical disk drive layer 84, and a second hard disk layer 85. The computer housing 1' includes a plurality of frames 3 and corresponding positioning plates 6. The length and width of the frames 3 must be the same, but the height thereof may vary. This embodiment is illustrated using frames 3 of two different heights. Pairs of the frames 3 can be slidably stacked with one on top of the other so that additional spaces are available to accommodate more hardware devices.

This embodiment differs from the first preferred embodiment in that, aside from an increase in the number of the frames 3 and the positioning plates 6 of the computer housing 1', the hardware unit 2' includes a high-wattage power source 26 in place of the external transformer, which is accommodated in the frame 3 closest to the bottom cover 5. Wires of the power source 26 are disposed to extend through the hollow portions in the connecting plates 33, i.e., power is supplied to the motherboard 21 through internal wiring.

The hardware unit 2' further includes an expansion card module 27 accommodated in another frame 3 and capable of being mounted uprightly on the motherboard 21. The storage device 23 of the hardware unit 2' not only includes the hard disk 231 and the card reader 232, it further includes, but is not limited to, a second hard disk 233 and an optical disk drive 234 received in the added frame 3. The storage device 23 may further include a floppy disk drive, a CD RW drive, etc., which are connected to the motherboard 21 through the hollow portions in the connecting plates 33 of the frames 3 by vertical mounting or internal wiring.

In sum, the present invention can have a compact size by virtue of a stacking design of modular frames, and can be expanded when required by increasing the number of the frames 3, thereby avoiding a waste of space. Besides, as the wires are routed internally, the aesthetical aspect of the computer device is also enhanced.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A stackable modular computer housing, comprising:
a rectangular frame including an upright left side plate, an upright right side plate, a connecting plate interconnecting said left and right side plates, two first slide portions extending respectively from top edges of said left and right side plates, and two second slide portions disposed respectively below said left and right side plates and parallel to said first slide portions, respectively;

a top cover including a rectangular top plate and two third slide portions disposed respectively at left and right lateral edges of said top plate, said third slide portions being engageable with said first slide portions, respectively, so as to be slidable forwardly and rearwardly relative to each other such that said top cover slidably covers a top side of said frame;

a bottom cover including a rectangular bottom plate and two fourth slide portions disposed respectively at left and right lateral edges of said bottom plate, said fourth slide portions being engageable with said second slide portions, respectively, so as to be slidable forwardly and rearwardly relative to each other such that said bottom cover slidably covers a bottom side of said frame; and two positioning plates covering front and rear openings of said frame, respectively.

2. The stackable modular computer housing according to claim 1, wherein said first slide portions of said frame and said fourth slide portions of said bottom cover are in the form of protruding rails, and said third slide portions of said top cover and said second slide portions of said frame are configured to match said protruding rails, respectively, and to extend lengthwise of said top cover and said left and right side plates of said frame, respectively.

3. The stackable modular computer housing according to claim 2, wherein said first slide portions of said frame are in the form of protruding rails that extend from said top edges of said left and right side plates toward each other.

4. The stackable modular computer housing according to claim 2, wherein each of said third slide portions includes a curved plate that extends downwardly and curvedly from a respective one of said left and right lateral edges of said top plate, and an L-shaped plate that extends downwardly from a lower surface of said top plate proximate to the respective one of said left and right lateral edges of said top plate and that further extends outwardly, said curved plate and said L-shaped plate of each of said third slide portions cooperatively defining a sliding groove that opens outwardly and that corresponds to the respective one of said first slide portions.

5. The stackable modular computer housing according to claim 2, wherein said fourth slide portions are in the form of protruding rails that extend upwardly and respectively from said left and right lateral edges of said bottom plate and that further extend inwardly toward each other.

6. The stackable modular computer housing according to claim 2, wherein said connecting plate is connected to bottom edges of said left and right side plates, said second slide portions extending downwardly from a bottom side of said connecting plate proximate to left and right edges of said connecting plate, respectively, and further extending outwardly in opposite directions such that said second slide portions have an L-shaped profile, each of said second slide portions cooperating with said connecting plate to define a sliding groove that opens outwardly.

7. The stackable modular computer housing according to claim 2, wherein each of said positioning plates is provided with screw holes at positions corresponding to said third slide portions of said top cover, said computer housing further comprising a plurality of fastening members that extend through said screw holes and that are retained at said third slide portions.

8. The stackable modular computer housing according to claim 1, wherein said frame further includes two retaining grooves provided respectively in inner surfaces of said left and right side plates and extending lengthwise of said left and right side plates, respectively, each of said positioning plates being provided with screw holes at positions corresponding to said retaining grooves, said computer housing further comprising a plurality of fastening members that extend through said screw holes and that are retained in said retaining grooves, respectively.

9. The stackable modular computer housing according to claim 1, wherein said connecting plate of said frame is connected to bottom edges of said left and right side plates and has a central hollow portion.

10. The stackable modular computer housing according to claim 9, further comprising an additional frame, said frames being stackable with one on top of the other such that said frames can slidably move relative to each other.

11. The stackable modular computer housing according to claim 1, wherein said frame, said top cover, said bottom cover, and said positioning frames are formed by aluminum extrusion.

12. A computer device, comprising:

a computer housing including:

a rectangular frame including an upright left side plate, an upright right side plate spaced apart from said left side plate, a connecting plate connected to bottom edges of said left and right side plates and having a central hollow portion, two first slide portions extending respectively from top edges of said left and right side plates, and two second slide portions disposed respectively below said left and right side plates and parallel to said first slide portions, respectively;

a top cover including a rectangular top plate and two third slide portions disposed respectively at left and right lateral edges of said top plate, said third slide portions being engageable with said first slide portions, respectively, so as to be slidable forwardly and rearwardly relative to each other such that said top cover slidably covers a top side of said frame;

a bottom cover including a rectangular bottom plate and two fourth slide portions disposed respectively at left and right lateral edges of said bottom plate, said fourth slide portions being engageable with said second slide portions, respectively, so as to be slidable forwardly and rearwardly relative to each other such that said bottom cover slidably covers a bottom side of said frame; and two positioning plates covering front and rear openings of said frame, respectively; and a hardware unit including a motherboard disposed on said connecting plate of said computer housing, a central processing unit disposed on said motherboard, and at least one storage device connected to said motherboard.

13. The computer device according to claim 12, wherein said at least one storage device of said hardware unit includes at least one of a hard disk and a card reader accommodated between said bottom plate and said motherboard and parallel to said motherboard.

14. The computer device according to claim 13, wherein said at least one storage device is secured on a positioning frame that is detachably secured to said connecting plate of said frame.

15. The computer device according to claim 12, wherein said hardware unit further includes a system fan mounted uprightly within said frame and disposed on one side of said motherboard.

16. The computer device according to claim 12, wherein said computer housing further includes an additional frame, said frames being stackable with one on top of the other such that said frames can slidably move relative to each other.

17. The computer device according to claim 16, wherein said hardware unit further includes a power source accommodated within said additional frame, and internal wiring that extends through said hollow portion in said connecting plate of said frame to enable said power source to supply electric power to said motherboard.

18. The computer device according to claim 16, wherein said at least one storage device of said hardware unit includes at least one of a floppy disk drive, a hard disk, an optical disk drive, and a card reader that is accommodated within said additional frame.

19. The computer device according to claim 16, wherein said hardware unit further includes an expansion card module primarily accommodated within said additional frame and mounted uprightly on said motherboard.

20. The computer device according to claim 12, wherein said first slide portions of said frame and said fourth slide portions of said bottom cover are in the form of protruding rails, and said third slide portions of said top cover and said second slide portions of said frame are configured to match said protruding rails, respectively, and to extend lengthwise of said top cover and said left and right side plates of said frame, respectively.

21. The computer device according to claim 20, wherein each of said positioning plates is provided with screw holes at positions corresponding to said third slide portions of said top cover, said computer housing further comprising a plurality of fastening members that extend through said screw holes and that are retained at said third slide portions.

22. The computer device according to claim 12, wherein said frame further includes two retaining grooves provided respectively in inner surfaces of said left and right side plates and extending lengthwise of said left and right side plates, respectively, each of said positioning plates being provided with screw holes at positions corresponding to said retaining grooves, said computer housing further comprising a plurality of fastening members that extend through said screw holes and that are retained in said retaining grooves, respectively.

* * * * *